(12) United States Patent
Liu et al.

(10) Patent No.: US 12,160,972 B2
(45) Date of Patent: Dec. 3, 2024

(54) HARD DISK BRACKET

(71) Applicant: PEGATRON CORPORATION, Taipei (TW)

(72) Inventors: Wei-Cheng Liu, Taipei (TW); Hsin-Kai Chuang, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 18/448,085

(22) Filed: Aug. 10, 2023

(65) Prior Publication Data

US 2024/0147651 A1    May 2, 2024

(30) Foreign Application Priority Data

Oct. 27, 2022    (TW) .................................. 111140863

(51) Int. Cl.
*H05K 7/14*    (2006.01)
*H05K 9/00*    (2006.01)

(52) U.S. Cl.
CPC ......... *H05K 7/1489* (2013.01); *H05K 9/0081* (2013.01)

(58) Field of Classification Search
CPC .. H05K 7/1489; H05K 7/1485; H05K 7/1488; H05K 7/1461; H05K 9/0081
USPC ........................................................ 248/314
See application file for complete search history.

(56) References Cited

U.S. PATENT DOCUMENTS

| | | | |
|---|---|---|---|
| 6,891,723 B1* | 5/2005 | Lin | G11B 33/025 361/679.33 |
| 8,023,263 B2* | 9/2011 | Crippen | G06F 1/187 361/679.33 |
| 8,243,435 B2* | 8/2012 | Li | G11B 33/124 361/679.37 |
| 8,246,129 B2* | 8/2012 | Wang | G06F 1/187 312/332.1 |
| 9,058,151 B2* | 6/2015 | Chou | G06F 1/16 |
| 9,442,538 B1* | 9/2016 | Chen | G06F 1/187 |
| 9,541,968 B2* | 1/2017 | Chen | H05K 5/0221 |
| 9,913,395 B2* | 3/2018 | Milligan | H05K 7/1409 |
| 10,750,630 B2* | 8/2020 | Tsorng | H05K 7/1487 |
| 2004/0100762 A1* | 5/2004 | Yuan | G11B 33/128 |
| 2005/0007734 A1* | 1/2005 | Peng | G11B 33/128 |
| 2007/0211422 A1* | 9/2007 | Liu | G06F 1/187 361/679.37 |
| 2011/0304960 A1* | 12/2011 | Lu | G06F 1/187 361/679.01 |
| 2018/0146569 A1* | 5/2018 | Schroeder | G11B 33/124 |

(Continued)

FOREIGN PATENT DOCUMENTS

| | | |
|---|---|---|
| CN | 102682824 | 9/2012 |
| CN | 101893919 | 3/2013 |

(Continued)

*Primary Examiner* — Nkeisha Smith
(74) *Attorney, Agent, or Firm* — J.C. PATENTS (57) ABSTRACT

A hard disk bracket configured to be installed on a case includes a tray, a base, a handle, a pin, and a latch. The tray has an accommodating space. The base is connected to the tray. The handle is disposed in the base and has a first slide part detachably fastened with the base. The pin is disposed through the handle and the base. The latch is disposed in the base and is detachably fastened with the case. The latch is fastened with the handle and has a second slide part penetrating the handle for extending outside the base.

10 Claims, 7 Drawing Sheets

(56) References Cited

U.S. PATENT DOCUMENTS

| | | | | |
|---|---|---|---|---|
| 2023/0116549 A1* | 4/2023 | Olesiewicz | .......... | G11B 33/142 |
| | | | | 361/818 |
| 2023/0225072 A1* | 7/2023 | Zhong | .................. | H05K 7/1487 |
| | | | | 211/26.2 |
| 2023/0413468 A1* | 12/2023 | Wu | ........................ | H05K 7/183 |
| 2024/0244785 A1* | 7/2024 | Chuang | ................ | H05K 7/1487 |

FOREIGN PATENT DOCUMENTS

| | | |
|---|---|---|
| TW | M302726 | 12/2006 |
| TW | M397015 | 1/2011 |

* cited by examiner

HARD DISK BRACKET

CROSS-REFERENCE TO RELATED APPLICATION

This application claims the priority benefit of Taiwan application serial no. 111140863, filed on Oct. 27, 2022. The entirety of the above-mentioned patent application is hereby incorporated by reference herein and made a part of this specification.

BACKGROUND

Technology Field

The disclosure relates to a structure for accommodating a hard disk, and in particular to a hard disk bracket.

Description of Related Art

Existing desktop computers and notebook computers have hard disks for storing data installed on hard disk racks in the computer. However, with the development of cloud technology, large-scale data centers are becoming more and more important to users. Users may connect to the cloud through the network to download the required data, eliminating the need to carry bulky laptops or external hard drives. Instead, they can use light smart phones and tablet computers. The storage system of the data center is composed of multiple cases, and each case may integrate multiple hard disks. To facilitate replacement or maintenance, modular hard disk brackets have been developed to accommodating hard disks.

The existing hard disk brackets are roughly divided into the lever type and the elastic arm type, based on the unlocking method. The unlocking methods of the two types of hard disk brackets are different and be required matching with specific specifications of the cases, which fail to meet the different operating needs of users within the same case.

SUMMARY

The disclosure provides a hard disk bracket, which may be unlocked by a user forcing the handle or the latch, so as to achieve the purpose of different operating needs.

The hard disk bracket of the disclosure is configured to be installed on a case, and includes a tray, a base, a handle, a pin, and a latch. The tray has an accommodating space. The base is connected to the tray. The handle is disposed in the base, and the handle has a first slide part. The first slide part is detachably fastened with the base. The pin is disposed through the handle and the base. The latch is disposed in the base and is detachably fastened with the case. The latch is fastened with the handle and has a second slide part. The second slide part penetrates the handle for extending outside the base. When forcing the first slide part, the first slide part is separated from the base, and the handle is adapted to drive the latch to rotate along the pin for being separated from the case. When forcing the second slide part, the second slide part is bent relative to the handle, so that the latch is separated from the case.

In an embodiment of the disclosure, an elastic member is further included. The elastic member is sleeved on the pin and has a first end and a second end, the first end abuts against the base, and the second end abuts against the handle.

In an embodiment of the disclosure, the above-mentioned base has two through holes, which respectively penetrate through opposite sides of the base, and the handle has a rotating ring, which is aligned with the two through holes.

In an embodiment of the disclosure, the above-mentioned elastic member is aligned with the two through holes and the rotating ring, and the pin is disposed through the two through holes, the rotating ring, and the elastic member.

In an embodiment of the disclosure, the above-mentioned base has a positioning slot, and the positioning slot is relatively far away from the pin. The handle has a convex part, the convex part is formed on the first slide part, and the convex part is adapted to be buckled in the positioning slot, so as to position the handle on the base.

In an embodiment of the disclosure, when forcing the first slide part, the first slide part is bent to drive the convex part to be unlocked off the positioning slot.

In an embodiment of the disclosure, the above-mentioned handle has an internal space and a slot, and the slot is formed on a top surface of the handle and runs through the internal space. The latch has a positioning part and a first locking member, the positioning part is connected to the second slide part and is located in the internal space, and the first locking member is disposed on the positioning part and fastened with the slot.

In an embodiment of the disclosure, the above-mentioned latch has a second locking member, which is disposed on the second slide part and protrudes from the handle and the tray to be fastened with the case.

In an embodiment of the disclosure, when forcing the second slide part, the second slide part is bent relative to the handle to drive the second locking member, so that the latch is separated from the case.

In an embodiment of the disclosure, an electromagnetic shielding member is further included, and the electromagnetic shielding member is sleeved on the periphery of the base.

Based on the above, the hard disk bracket of the disclosure is adapted to carry a hard disk and be installed on the case, and the disclosure has two unlocking methods. When an applicator forces the first slide part, the first slide part is separated from the base, the latch is driven through the handle to rotate along the pin and extend outside the base, and the hard disk bracket is pulled out from the case by using the principle of leverage of the handle and the latch during the rotation process to achieve labor-saving effect. When forcing the second slide part, the second slide part is bent relative to the handle, so that the latch is no longer fastened with the case, and at this time, the hard disk bracket may be manually pulled out from the case.

DESCRIPTION OF THE EMBODIMENTS

Figure 1:
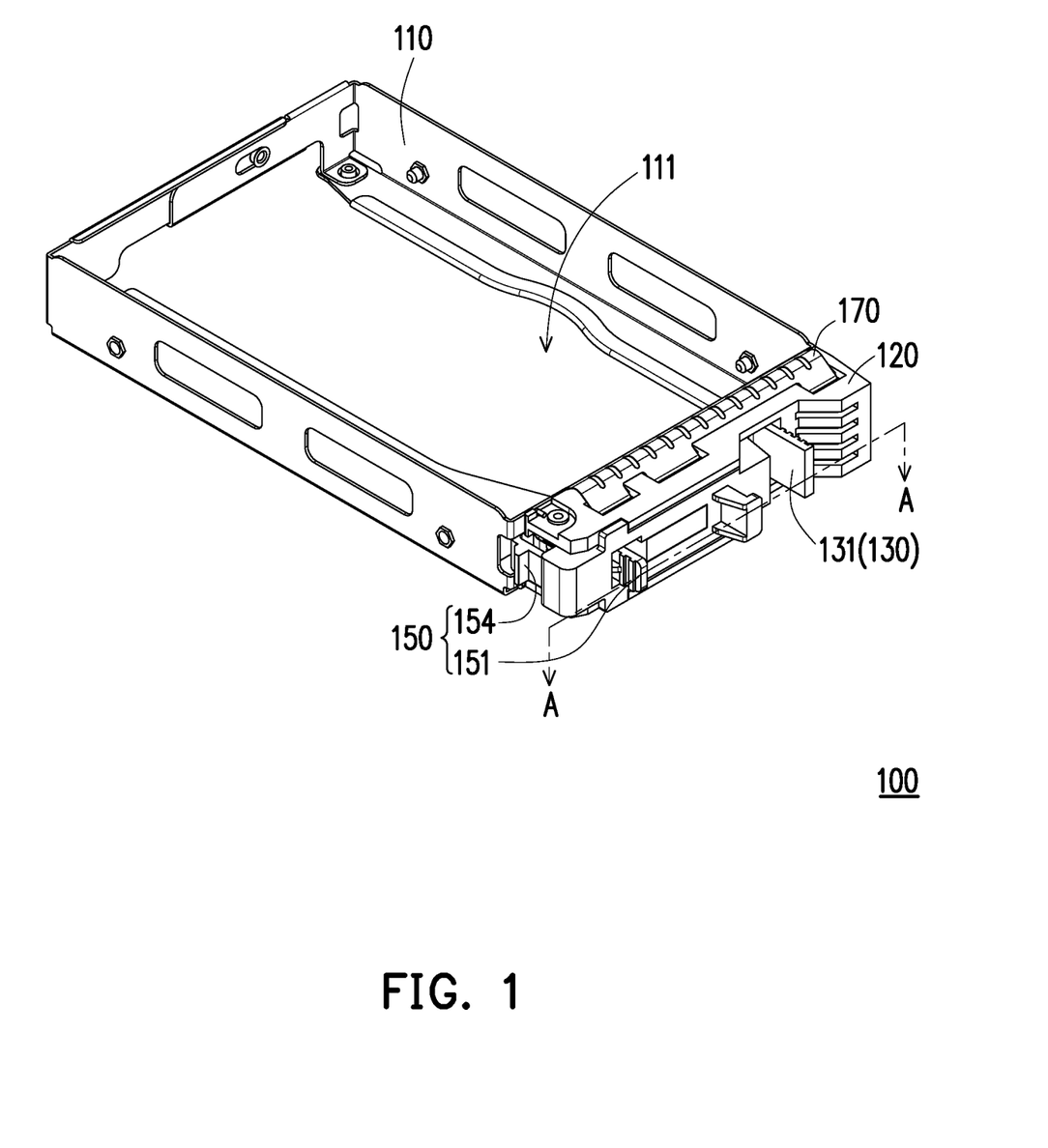
FIG. 1 is a perspective view of a hard disk bracket according to a first embodiment of the disclosure.
Figure 2:
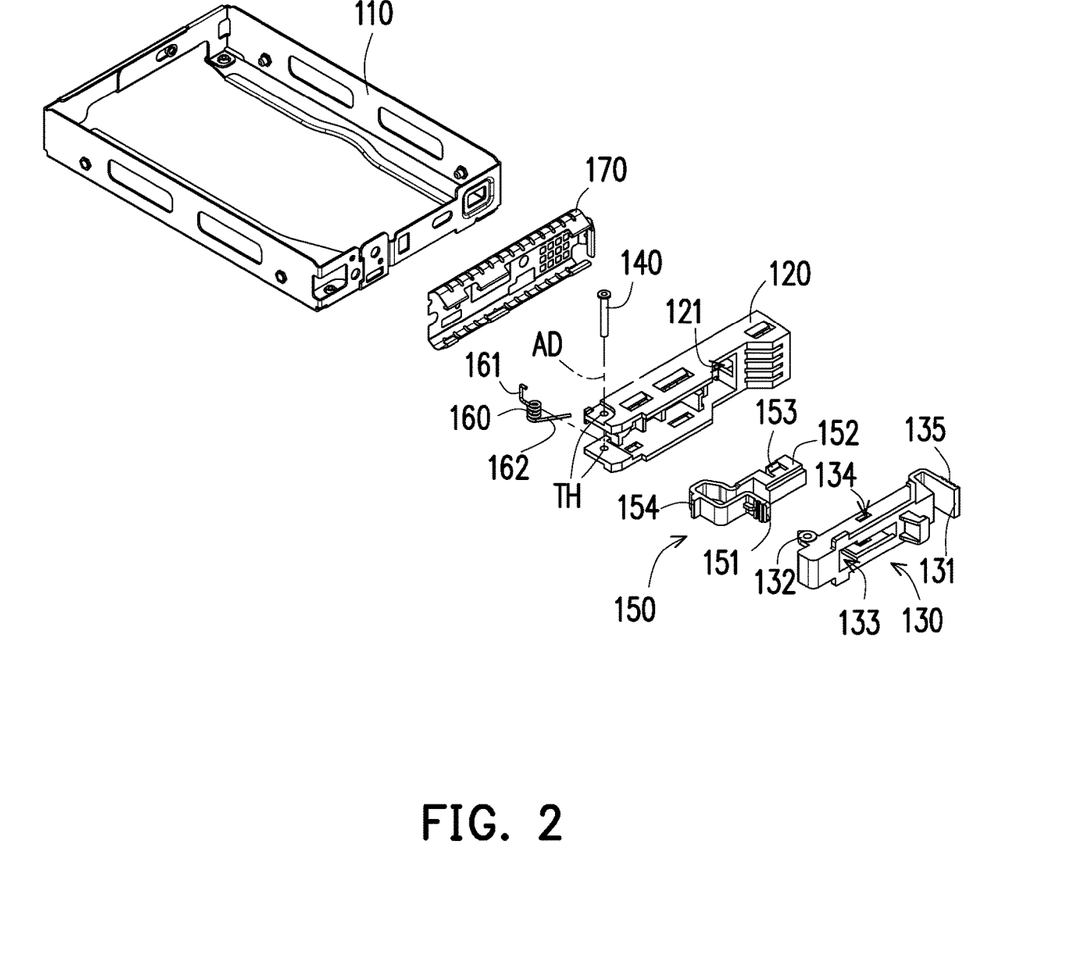
FIG. 2 is an exploded schematic view of elements of the hard disk bracket of FIG. 1.
Figure 3:
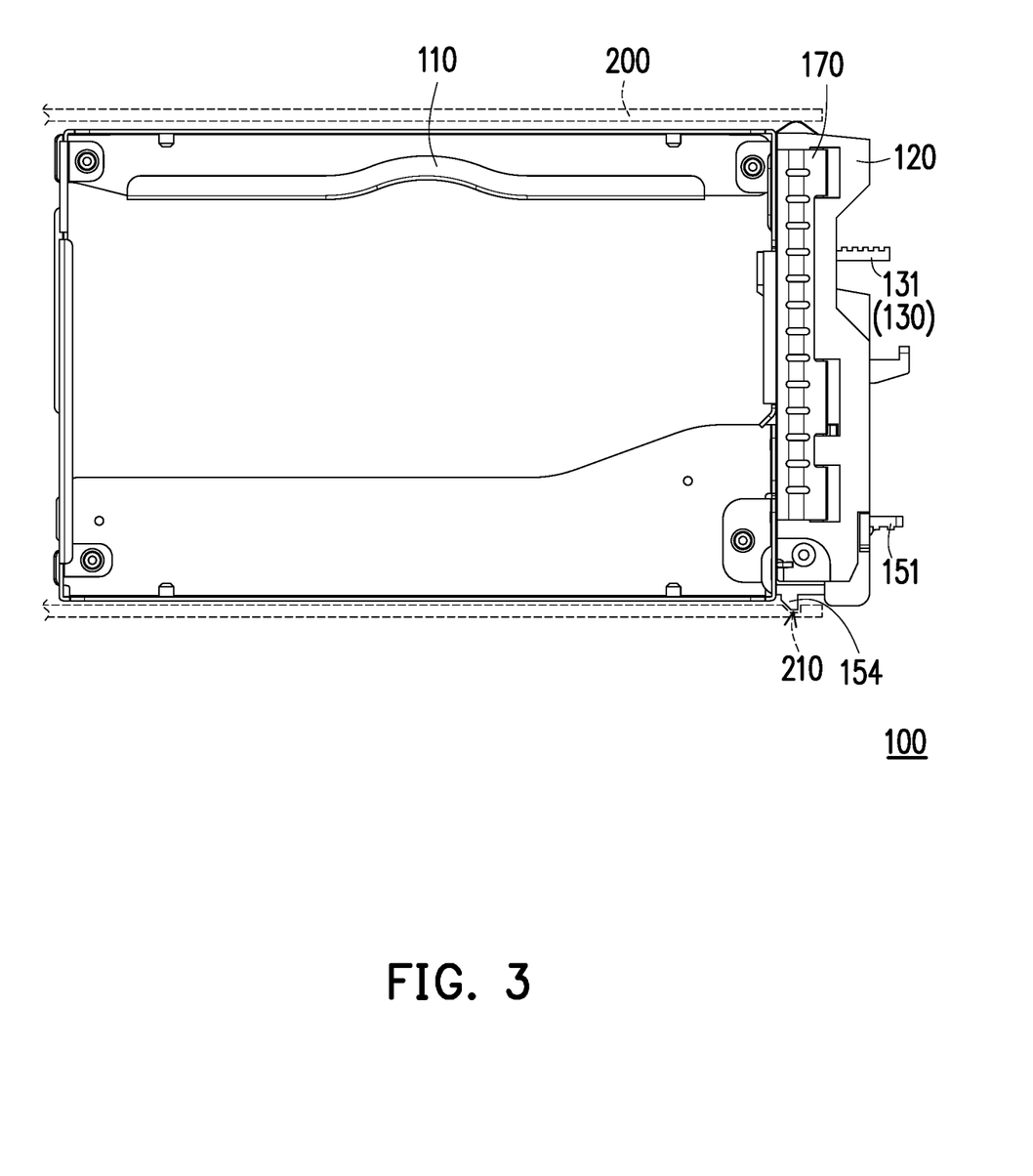
FIG. 3 is a schematic top view of the hard disk bracket of FIG. 1.
Figure 4:
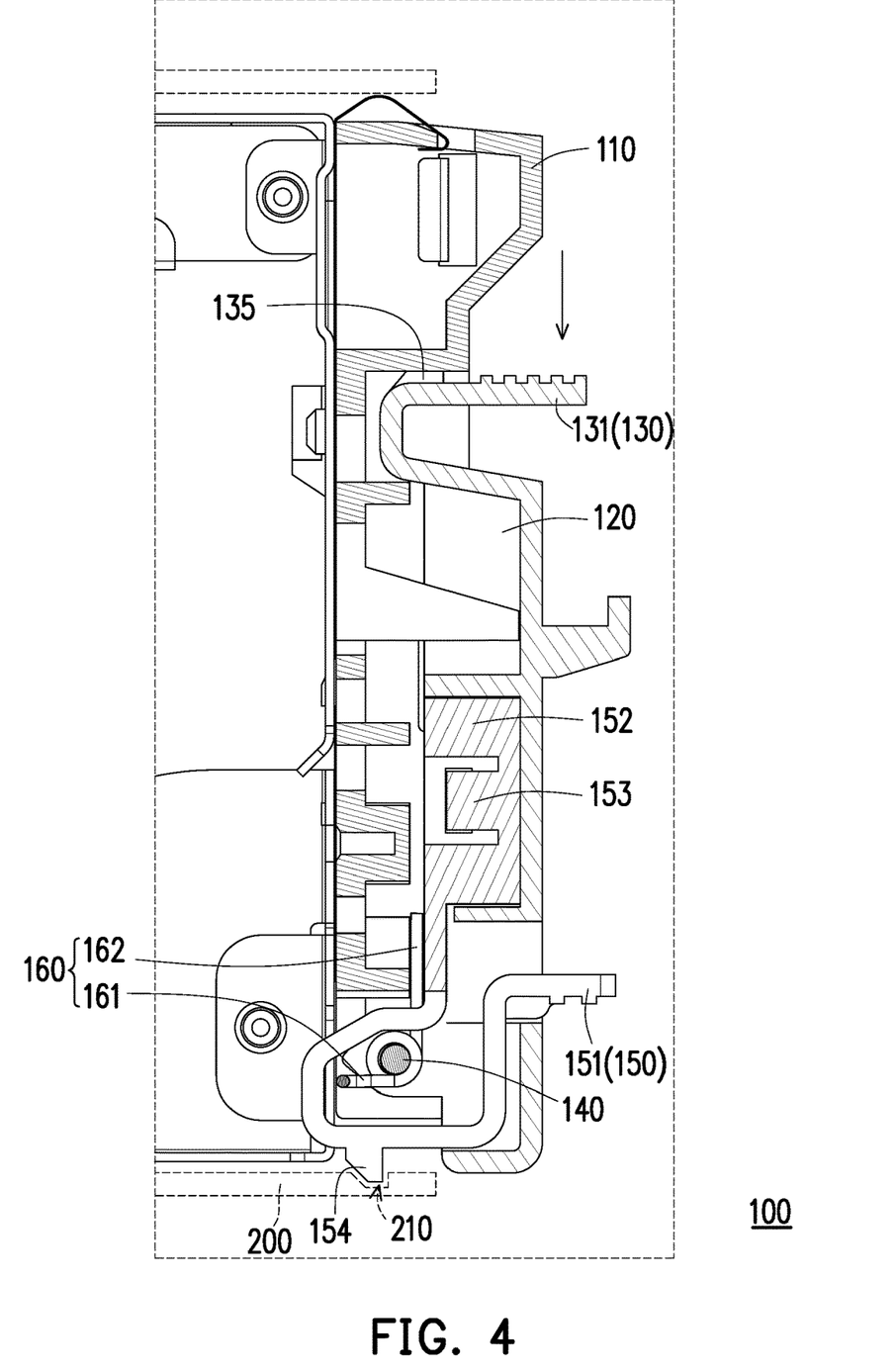
FIG. 4 is a partial cross-sectional view of the hard disk bracket of FIG. 1 along a line A-A.

FIG. 1 is a perspective view of a hard disk bracket according to a first embodiment of the disclosure. FIG. 2 is an exploded schematic view of elements of the hard disk bracket of FIG. 1. FIG. 3 is a schematic top view of the hard disk bracket of FIG. 1. FIG. 4 is a partial cross-sectional view of the hard disk bracket of FIG. 1 along a line A-A.

Referring to FIGS. 1 to 3, a hard disk bracket 100 of the disclosure is adapted to carry a hard disk (not shown in the figure) and be installed on a case 200. In a practical application, multiple hard disks may be integrated in one case 200 through multiple hard disk brackets 100 to serve as a data storage system.

Referring to FIGS. 1 to 3, the hard disk bracket 100 includes a tray 110, a base 120, a handle 130, a pin 140, and a latch 150.

The tray 110 has an accommodating space 111, which is configured to accommodate a hard disk, and the tray 110 is made of, for example, multiple metal plates or multiple plastic plates. The base 120 is connected to a front side of the tray 110, and the base 120 and the tray 110 are connected to each other by fastening or screwing. The handle 130 is disposed in the base 120 and has a first slide part 131, and the first slide part 131 of the handle 130 is detachably fastened with the base 120. The pin 140 is disposed through the handle 130 and the base 120, so that the handle 130 may rotate relative to the base 120 along the pin 140. The latch 150 is disposed in the base 120 and is detachably fastened with the case 200. The latch 150 is fastened with the handle 130 and has a second slide part 151. The second slid part 151 of the latch 150 penetrates the handle 130 for extending outside the base 120, and the latch 150 is made of elastic materials.

With reference to FIG. 4, the hard disk bracket 100 includes an elastic member 160, which is sleeved on the pin 140 and has a first end 161 and a second end 162. The first end 161 abuts against the base 120, and the second end 162 abuts against the handle 130, thereby providing elastic force to the handle 130.

Referring to FIGS. 1 and 2, the base 120 has two through holes TH, which respectively penetrate through the opposite sides of the base 120. The handle 130 has a rotating ring 132, which is aligned with the two through holes TH. The elastic member 160 is aligned with the two through holes TH and the rotating ring 132, which means that the two through holes TH, the rotating ring 132, and the elastic member 160 are located on the same axial direction AD, and the pin 140 is disposed through the two through holes TH, the rotating ring 132, and the elastic member 160. In this way, the rotating ring 132 of the handle 130 pivots in the base 120 with the pin 140 as the center of rotation, and the handle 130 drives the latch 150 to rotate synchronously.

Referring to FIGS. 2 and 4, the handle 130 has an internal space 133 and a slot 134. The slot 134 is formed on a top surface TS of the handle 130 and runs through the internal space 133. The latch 150 has a positioning part 152, a first locking member 153, and a second locking member 154. The positioning part 152 is connected to the second slide part 151 and is located in the internal space 133. The first locking member 153 is disposed on the positioning part 152 and fastened with the slot 134, thereby connecting the latch 150 and the handle 130 as a whole. The second locking member 154 is disposed on the second slide part 151 and protrudes from the handle 130 and the tray 110 to be fastened with the case 200.

Referring to FIGS. 1 and 2, the hard disk bracket 100 includes an electromagnetic shielding member 170, which is sleeved on the periphery of the base 120 to block part of an electromagnetic wave in the environment to reduce the impact on the hard disk and the data storage system.

Figure 5:
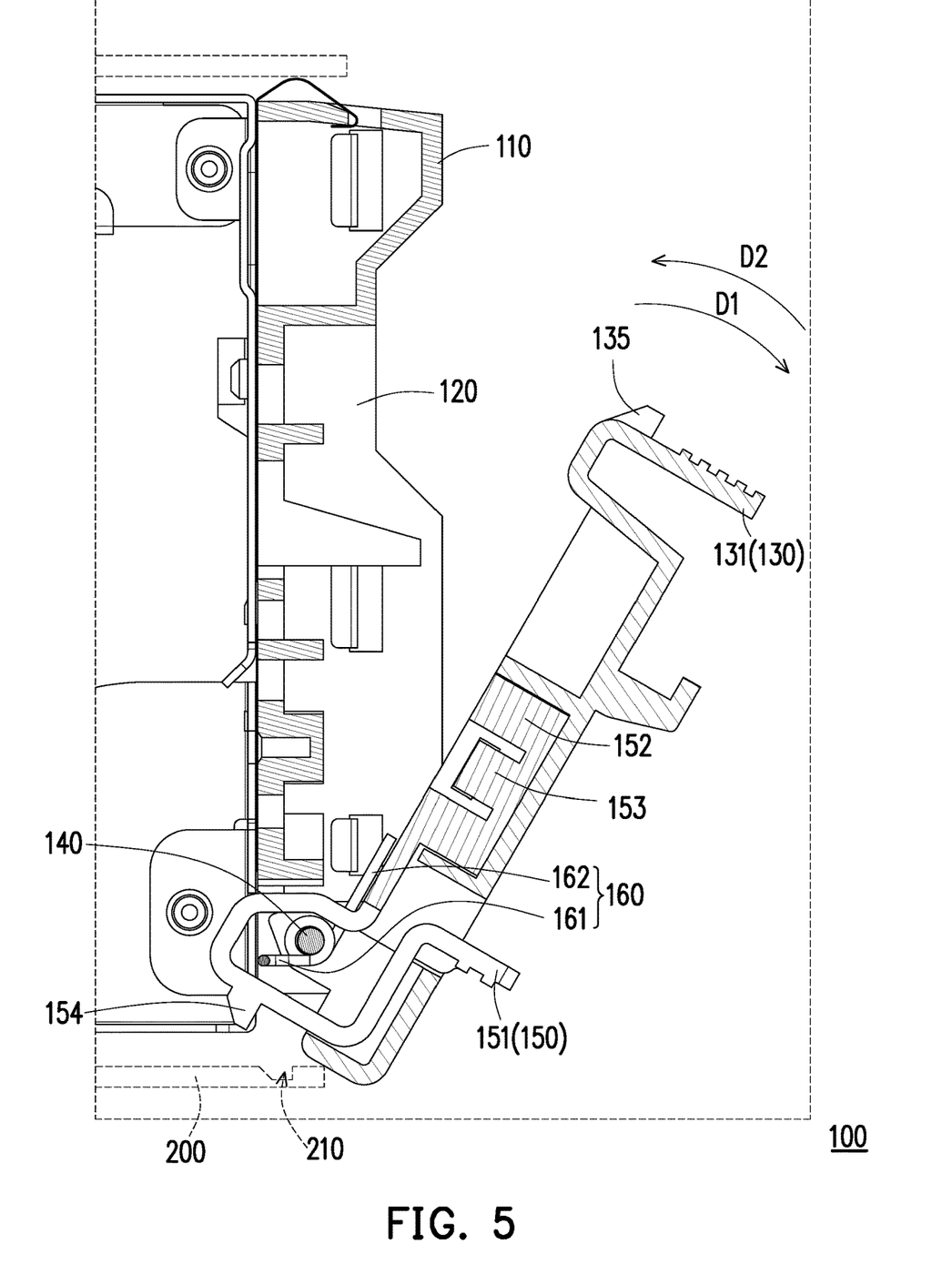
FIG. 5 is a schematic diagram of the rotation of the handle of the hard disk bracket of FIG. 4 relative to the base.
Figure 6:
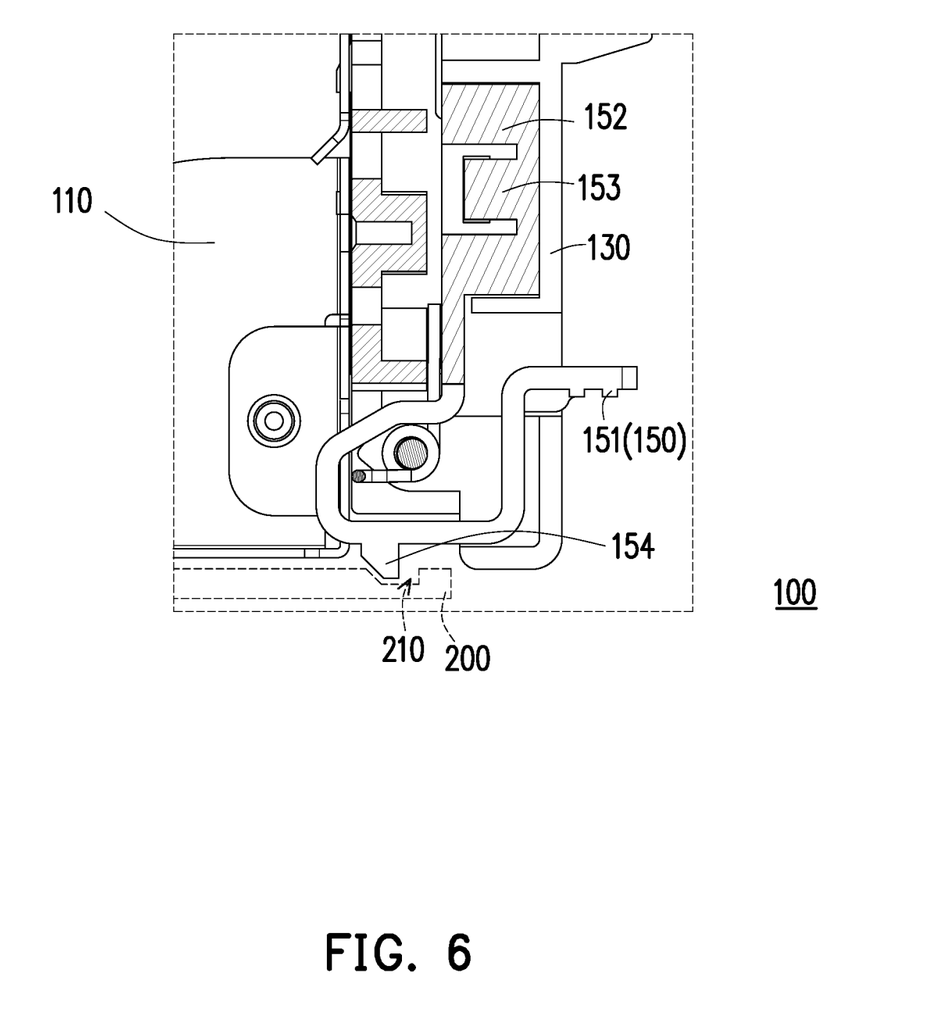
FIG. 6 is a partially enlarged schematic view of the hard disk bracket of FIG. 4.
Figure 7:
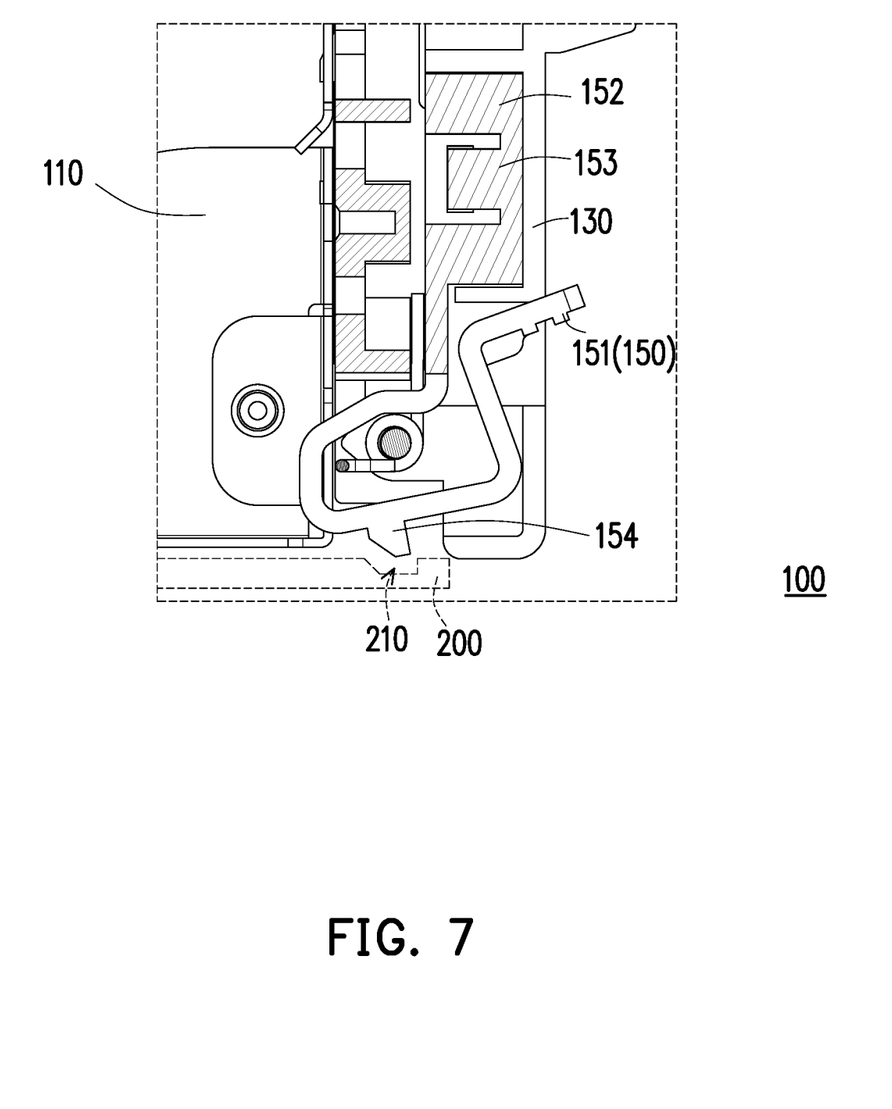
FIG. 7 is a schematic diagram showing the movement of the latch of the hard disk bracket of FIG. 6 being bent relative to the base.

FIG. 5 is a schematic diagram of the rotation of the handle of the hard disk bracket of FIG. 4 relative to the base. FIG. 6 is a partially enlarged schematic view of the hard disk bracket of FIG. 4. FIG. 7 is a schematic diagram showing the movement of the latch of the hard disk bracket of FIG. 6 being bent relative to the base.

Referring to FIGS. 2 and 4, the base 120 has a positioning slot 121, and the positioning slot is formed on a side of the base 120 relatively away from the pin 140. The handle 130 has a convex part 135, and the convex part 135 is formed on the first slide part 131. The convex part 135 is adapted to be buckled in the positioning slot 121 of the base 120 to position the handle 130 on the base 120.

Referring to FIG. 4, the hard disk bracket 100 is disposed in the case 200, and the second locking member 154 of the latch 150 is fastened with a groove 210 of the case 200 to position the hard disk bracket 100 in the case 200.

The first unlocking method is as follows.

Referring to FIGS. 4 and 5, when forcing the first slide part 131, the first slide part 131 is bent to drive the convex part 135 to unlock the positioning groove 121 of the base 120, and at this time the elastic member 160 pushes the handle 130 to rotate. In this situation, since the first slide part 131 is separated from the base 120, and the elastic member 160 releases the elastic force to drive the handle 130 to rotate relative to the base 120, the handle 130 is adapted to drive the latch 150 along the pin 140 toward a first direction D1 for being separated from the case 200, so that the second locking member 154 of the latch 150 is separated from the groove 210 of the case 200.

Next, the ejected handle 130 is continuously rotated toward the first direction D1, so that the handle 130 and the case 200 form a fulcrum, and the hard disk bracket 100 is driven and separated from the case 200 through the principle of leverage to achieve labor-saving effect.

Referring to FIGS. 5 and 4, on the contrary, when the hard disk bracket 100 is to be installed on the case 200, the handle 130 is pushed and rotated in a second direction D2 opposite to the first direction D1, so that the convex part 135 is fastened with the positioning slot 121 of the base 120, and the handle 130 compresses the elastic member 160, while the handle 130 drives the second locking member 154 of the latch 150 to be fastened with the groove 210 of the case 200.

The second unlocking method is as follows.

Referring to FIGS. 6 and 7, when forcing the second slide part 151 of the latch 150, the second slide part 151 is bent relative to the handle 130, so that the latch 150 is separated from the case 200, and the second slide part 151 drives the second locking member 154 into the handle 130 and the tray 110, so that the second locking member 154 of the latch 150 is separated from the groove 210 of the case 200. At this time, the latch 150 and the case 200 no longer have a fastening relationship, and the user then pulls the handle 130 to drive the hard disk bracket 100 to be separated from the case 200. After released from forcing the second slide part 151, the second slide part 151 elastically returns to the original position.

On the contrary, referring to FIGS. 7 and 6, when the hard disk bracket 100 is to be installed on the case 200, the user directly pushes the hard disk bracket 100 into the case 200, so that the second slide part 151 is squeezed by the case 200 and fastened with the groove 210 again.

To sum up, the hard disk bracket of the disclosure is adapted to carry a hard disk and be installed on the case, and the disclosure has two unlocking methods. When an applicator forces the first slide part, the first slide part is separated from the base, the latch is driven through the handle to rotate along the pin and extend outside the base, and the hard disk bracket is pulled out from the case by using the principle of leverage of the handle and the latch during the rotation process to achieve labor-saving effect. When forcing the second slide part, the second slide part is bent relative to the handle, so that the latch is no longer fastened with the case, and at this time, the hard disk bracket may be manually pulled out from the case.

What is claimed is:

1. A hard disk bracket, configured to be installed on a case, comprising:
    a tray, having an accommodating space;
    a base, connected to the tray;
    a handle, disposed in the base, the handle having a first slide part, and the first slide part being detachably fastened with the base;
    a pin, disposed through the handle and the base; and
    a latch, disposed in the base and detachably fastened with the case, the latch being fastened with the handle and having a second slide part, and the second slide part penetrating the handle for extending outside the base,
    wherein when forcing the first slide part, the first slide part is separated from the base, and the handle is adapted to drive the latch to rotate along the pin for being separated from the case, when forcing the second slide part, the second slide part is bent relative to the handle, so that the latch is separated from the case.

2. The hard disk bracket according to claim 1, further comprising an elastic member, sleeved on the pin and having a first end and a second end, the first end abutting against the base, and the second end abutting against the handle.

3. The hard disk bracket according to claim 2, wherein the base has two through holes, which respectively penetrate through opposite sides of the base, and the handle has a rotating ring, which is aligned with the two through holes.

4. The hard disk bracket according to claim 3, wherein the elastic member is aligned with the two through holes and the rotating ring, and the pin is disposed through the two through holes, the rotating ring, and the elastic member.

5. The hard disk bracket according to claim 1, wherein the base has a positioning slot, the positioning slot is away from the pin, the handle has a convex part, the convex part is formed on the first slide part, and the convex part is adapted to be buckled in the positioning slot, so as to position the handle on the base.

6. The hard disk bracket according to claim 5, wherein when forcing the first slide part, the first slide part is bent to drive the convex part to be unlocked off the positioning slot.

7. The hard disk bracket according to claim 1, wherein the handle has an internal space and a slot, the slot is formed on a top surface of the handle and runs through the internal space, the latch has a positioning part and a first locking member, the positioning part is connected to the second slide part and is located in the internal space, and the first locking member is disposed on the positioning part and fastened with the slot.

8. The hard disk bracket according to claim 1, wherein the latch has a second locking member, which is disposed on the second slide part, and the second locking member protrudes from the handle and the tray to be fastened with the case.

9. The hard disk bracket according to claim 8, wherein when forcing the second slide part, the second slide part is bent relative to the handle to drive the second locking member, so that the latch is separated from the case.

10. The hard disk bracket according to claim 1, further comprising an electromagnetic shielding member, sleeved on a periphery of the base.

* * * * *